US012660336B2

(12) United States Patent
Kim

(10) Patent No.: US 12,660,336 B2
(45) Date of Patent: Jun. 16, 2026

(54) IMAGE SENSING DEVICE INCLUDING OVERCOATING LAYER BETWEEN COLOR FILTERS AND METHOD OF MANUFACTURING THE SAME

(71) Applicant: SK hynix Inc., Icheon-si (KR)

(72) Inventor: Won Jin Kim, Icheon-si (KR)

(73) Assignee: SK HYNIX INC., Icheon-si (KR)

( * ) Notice: Subject to any disclaimer, the term of this patent is extended or adjusted under 35 U.S.C. 154(b) by 403 days.

(21) Appl. No.: 18/365,065

(22) Filed: Aug. 3, 2023

(65) Prior Publication Data

US 2024/0194722 A1     Jun. 13, 2024

(30) Foreign Application Priority Data

Dec. 13, 2022    (KR) ........................ 10-2022-0173636

(51) Int. Cl.
*H10F 39/00* (2025.01)

(52) U.S. Cl.
CPC ....... *H10F 39/024* (2025.01); *H10F 39/8053* (2025.01); *H10F 39/8063* (2025.01)

(58) Field of Classification Search
CPC . H10F 39/024; H10F 39/8053; H10F 39/8063
See application file for complete search history.

(56) References Cited

U.S. PATENT DOCUMENTS

| | | | | |
|---|---|---|---|---|
| 2013/0307107 A1* | 11/2013 | Tsai | ...................... | H10F 39/026 |
| | | | | 257/E31.127 |
| 2021/0066374 A1* | 3/2021 | Kim | ................... | H10F 39/8053 |
| 2021/0091131 A1* | 3/2021 | Cho | ................... | H10F 39/8067 |
| 2022/0190020 A1* | 6/2022 | Kim | ................... | H10F 39/8057 |
| 2024/0063238 A1* | 2/2024 | Maruyama | .......... | H10F 39/1825 |

FOREIGN PATENT DOCUMENTS

| | | |
|---|---|---|
| KR | 20070047410 A | 5/2007 |
| KR | 20130127907 A | 11/2013 |

* cited by examiner

*Primary Examiner* — Nelson Garces
(74) *Attorney, Agent, or Firm* — Perkins Coie LLP

(57) ABSTRACT
A method for manufacturing an image sensing device includes forming a grid structure over a semiconductor substrate to provide spaces for disposing color filters, forming first color filters, second color filters, third color filters in some of the spaces defined by the grid structure, the first color filters, the second color filters, and the third color filters configured to transmit light corresponding to a first color, a second color, and a third color, respectively, forming an overcoating layer to cover the first to third color filters, the overcoating layer filling remaining spaces of the spaces defined by the grid structure, the remaining spaces free of the first to third color filters, and forming microlenses over the overcoating layer.

18 Claims, 10 Drawing Sheets

IMAGE SENSING DEVICE INCLUDING OVERCOATING LAYER BETWEEN COLOR FILTERS AND METHOD OF MANUFACTURING THE SAME

CROSS-REFERENCE TO RELATED APPLICATION

This patent document claims the priority and benefits of Korean patent application No. 10-2022-0173636, filed on Dec. 13, 2022, which is incorporated by reference in its entirety as part of the disclosure of this patent document.

TECHNICAL FIELD

The technology and implementations disclosed in this patent document generally relate to an image sensing device and a method for manufacturing the same.

BACKGROUND

An image sensor is used in electronic devices to convert optical images into electrical signals. With the recent development of automotive, medical, computer and communication industries, the demand for highly integrated, higher-performance image sensors has been rapidly increasing in various electronic devices such as digital cameras, camcorders, personal communication systems (PCSs), video game consoles, surveillance cameras, medical micro-cameras, robots, etc.

SUMMARY

Various embodiments of the disclosed technology relate to a method for more easily forming color filters of an image sensing device including white color filters.

In accordance with an embodiment of the disclosed technology, a method for manufacturing an image sensing device may include forming a grid structure over a semiconductor substrate to provide spaces for disposing color filters; forming first color filters, second color filters, third color filters in some of the spaces defined by the grid structure, the first color filter, the second color filter, and the third color filters configured to transmit light corresponding to a first color, a second color, and a third color, respectively; forming an overcoating layer to cover the first to third color filters, the overcoating layer filling remaining spaces of the spaces defined by the grid structure, the remaining spaces free of the first to third color filters; and forming microlenses over the overcoating layer.

In accordance with another embodiment of the disclosed technology, an image sensing device may include: a grid structure disposed over a semiconductor substrate and including a portion that is filled with air and configured as an air layer; a plurality of first color filters disposed in first spaces among the spaces defined by the grid structure, each first color filter configured to transmit light corresponding to a first color; a plurality of second color filters disposed in second spaces among the spaces defined by the grid structure, each second color filter configured to transmit light corresponding to a second color; a plurality of third color filters disposed in third spaces among the spaces defined by the grid structure, each third color filter configured to transmit light corresponding to a third color; an overcoating layer disposed in fourth spaces among the spaces defined by the grid structure and covering the first to third color filters; and a plurality of microlenses disposed over the overcoating layer.

It is to be understood that both the foregoing general description and the following detailed description of the disclosed technology are illustrative and explanatory and are intended to provide further explanation of the disclosure as claimed.

BRIEF DESCRIPTION OF THE DRAWINGS

The above and other features and beneficial aspects of the disclosed technology will become readily apparent with reference to the following detailed description when considered in conjunction with the accompanying drawings.

DETAILED DESCRIPTION

This patent document provides implementations and examples of an image sensing device and a method for manufacturing the same that may be used to substantially address one or more technical or engineering issues and mitigate limitations or disadvantages encountered in some other image sensing devices. Some implementations of the disclosed technology suggest examples of a method for more easily forming color filters of an image sensing device including white color filters. The disclosed technology provides various implementations of the image sensing device that can more easily form color filters of the image sensing device including white color filters.

Reference will now be made in detail to certain embodiments, examples of which are illustrated in the accompanying drawings. Wherever possible, the same reference numbers will be used throughout the drawings to refer to the same or similar parts. In the following description, a detailed description of related known configurations or functions incorporated herein will be omitted to avoid obscuring the subject matter.

Hereafter, various embodiments will be described with reference to the accompanying drawings. However, it should be understood that the disclosed technology is not limited to specific embodiments, but includes various modifications, equivalents and/or alternatives of the embodiments. The embodiments of the disclosed technology may provide a variety of effects capable of being directly or indirectly recognized through the disclosed technology.

Figure 1:
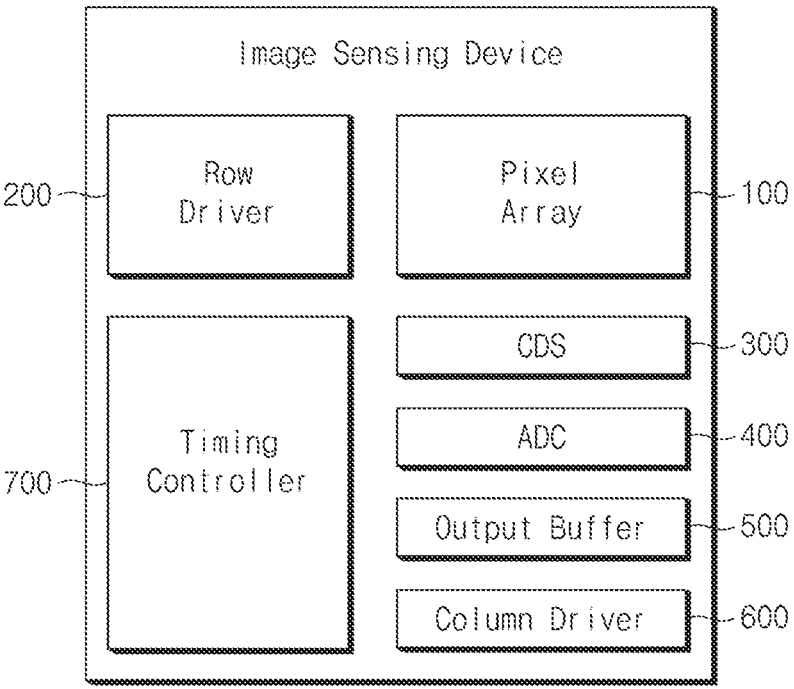
FIG. 1 is a block diagram illustrating an example of an image sensing device based on some implementations of the disclosed technology.

FIG. 1 is a block diagram illustrating an image sensing device based on some implementations of the disclosed technology.

Referring to FIG. 1, the image sensing device may include a pixel array 100, a row driver 200, a correlated double sampler (CDS) 300, an analog-to-digital converter (ADC) 400, an output buffer 500, a column driver 600, and a timing controller 700.

The pixel array 100 may include a plurality of unit pixels consecutively arranged in row and column directions. Each of the unit pixels may generate an electrical signal (pixel signal) in response to incident light through photoelectric conversion of incident light received from the outside. Each of the unit pixels may include any one of a red color filter, a green color filter, a blue color filter, and a white color filter. The red color filter, the green color filter, and the blue color filter are configured to transmit portions of the incident light corresponding to the red color, the green color, and the blue color, respectively. The white color filter may transmit visible light of all colors including the red color, the green color, and the blue color, and may be formed with an overcoating layer (also called an overcoating film) of a lens layer. In some implementations, the white color filters are a portions of the overcoating layer.

The pixel array 100 may receive driving signals (for example, a row selection signal, a reset signal, a transmission (or transfer) signal, etc.) from the row driver 200. Upon receiving the driving signal, the unit pixels may be activated to perform the operations corresponding to the row selection signal, the reset signal, and the transfer signal.

The row driver 200 may activate the pixel array 100 to perform certain operations on the unit pixels in the corresponding row based on control signals provided by controller circuitry such as the timing controller 700.

The correlated double sampler (CDS) 300 may remove undesired offset values of the unit pixels using correlated double sampling. The CDS 300 may transfer the reference signal and the pixel signal of each of the columns as a correlate double sampling (CDS) signal to the ADC 400 based on control signals from the timing controller 700.

The ADC 400 is used to convert analog CDS signals received from the CDS 300 into digital signals.

The output buffer 500 may temporarily store column-based image data provided from the ADC 400 based on control signals of the timing controller 700.

The column driver 600 may select a column of the output buffer 500 upon receiving a control signal from the timing controller 700, and sequentially output the image data, which are temporarily stored in the selected column of the output buffer 500.

The timing controller 700 may generate signals for controlling operations of the row driver 200, the ADC 400, the output buffer 500 and the column driver 600.

Figure 2:
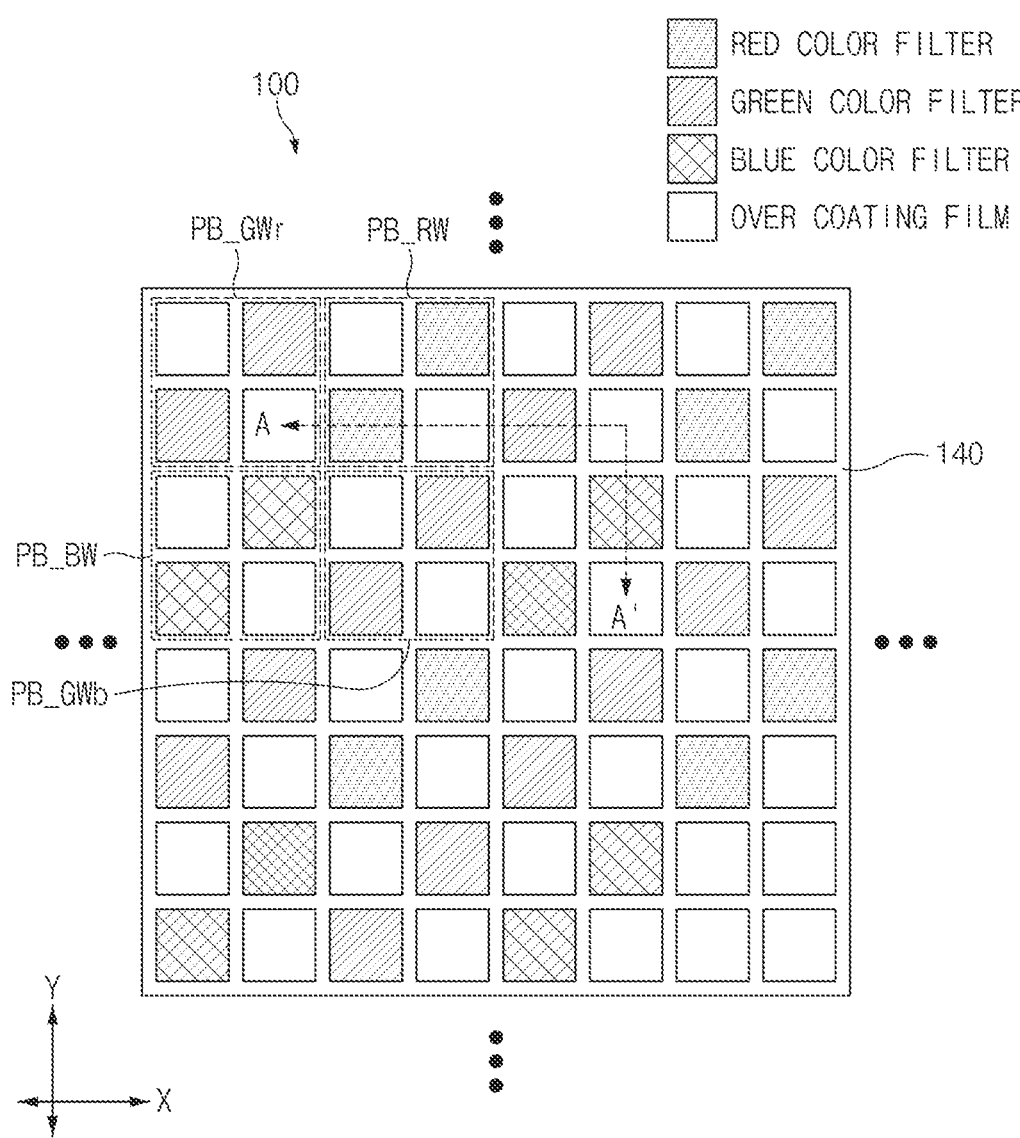
FIG. 2 is a schematic diagram illustrating an example of a planar structure in which pixels are arranged in a pixel array of FIG. 1 based on some implementations of the disclosed technology.

FIG. 2 is a schematic diagram illustrating an example of a planar structure in which pixels are arranged in the pixel array 100 of FIG. 1 based on some implementations of the disclosed technology.

Referring to FIG. 2, the pixel array 100 may include a plurality of sub-pixel blocks (PB_RW, PB_GWr, PB_GWb, PB_BW). The sub-pixel blocks (PB_RW, PB_GWr, PB_GWb, PB_BW) may be arranged adjacent to each other in a (2×2) array including two columns and two rows. The sub-pixel blocks (PB_RW, PB_GWr, PB_GWb, PB_BW) arranged in the (2×2) array may be consecutively arranged in X-axis and Y-axis directions.

In some implementations, each of the sub-pixel blocks (PB_RW, PB_GWr, PB_GWb, PB_BW) may include a structure in which a plurality of unit pixels is arranged adjacent to each other in an (N×N) array (where, N is a natural number of 2 or greater). Each unit pixel may generate an electrical signal (pixel signal) corresponding to incident light through photoelectric conversion of the incident light.

In some implementations, each of the sub-pixel blocks (PB_RW, PB_GWr, PB_GWb, PB_BW) may have a structure in which four unit pixels are arranged adjacent to each other in a (2×2) array. In this case, each of the sub-pixel blocks (PB_RW, PB_GWr, PB_GWb, PB_BW) may include color filters corresponding two different colors.

For example, the sub-pixel block (PB_RW) may include two red color pixels and two white color pixels. The two red color pixels may be arranged adjacent to each other in a first diagonal direction, and each of the two red color pixels may include a red color filter. The two white color pixels may be arranged adjacent to each other in a second diagonal direction crossing the first diagonal direction, and each of the two white color pixels may include an overcoating layer (OCL) (also called an overcoating film) as a color filter. The sub-pixel block (PB_GWr) and the sub-pixel block (PB_GWb) may include two green color pixels and two white color pixels, respectively. In this case, the two green color pixels may be arranged adjacent to each other in the first diagonal direction, and each of the two green color pixels may include a green color filter. The two white color pixels may be arranged adjacent to each other in the second diagonal direction, and each of the two white color pixels may include an overcoating layer as a color filter. The sub-pixel block (PB_BW) may include two blue color pixels and two white color pixels. In this case, the two blue color pixels may be arranged adjacent to each other in the first diagonal direction, and each of the two blue color pixels may include a blue color filter. The two white color pixels may be arranged adjacent to each other in the second diagonal direction, and each of the two white color pixels may include an overcoating layer as a color filter. In some implementations, the white color pixel may represent a pixel in which an overcoating layer is formed as a color filter in a space defined by a grid structure 140. As to be discussed in detail, the overcoating layer forms the lens layer together with the microlenses. Since the overcoating layer is formed at a position where the white color filter is formed, the overcoating layer can serve as a white color filter. In some implementations, the white color filter may represent the overcoating layer disposed in a space defined by a grid structure 140.

Based on the red color filter, the green color filter, and the blue color filter included in the sub-pixel blocks (PB_RW, PB_GWr, PB_GWb, PB_BW), the sub-pixel blocks (PB_RW, PB_GWr, PB_GWb, PB_BW) may be arranged in a Bayer pattern. In addition, when the pixel array 100 is viewed as a whole, the overcoating layer may be disposed between the red color filters, the green color filters, and the blue color filters so that the red color filters, the green color filters, and the blue color filters are not adjacent to each other.

The grid structure 140 may be disposed between the overcoating layers and the color filters. For example, the color filters and the overcoating layers may be alternately formed in spaces defined by the grid structure 140. The grid structure 140 may include an air layer. For example, the grid structure 140 may include a hybrid structure in which a metal layer and an air layer are stacked.

Figure 3:
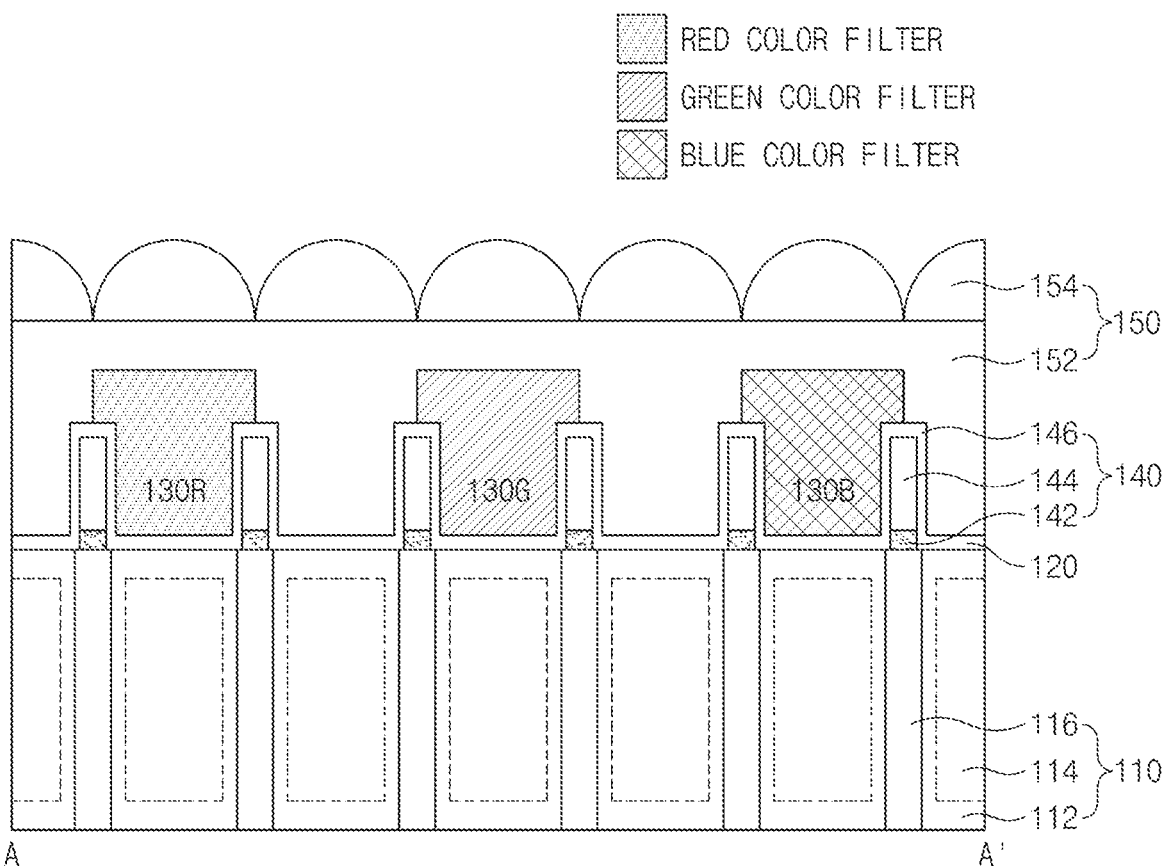
FIG. 3 is a cross-sectional view illustrating an example of the pixel array taken along the line A-A' shown in FIG. 2 based on some implementations of the disclosed technology.

FIG. 3 is a cross-sectional view illustrating an example of the pixel array 100 taken along the line A-A' shown in FIG. 2 based on some implementations of the disclosed technology.

Referring to FIG. 3, the pixel array 100 may include a substrate layer 110, an anti-reflection layer 120, a color filter layer 130 (including 130R, 130G, and 130B), a grid structure 140, and a lens layer 150.

The substrate layer 110 may include a substrate 112, a plurality of photoelectric conversion regions 114, and a plurality of device isolation structures 116. The substrate layer 110 may include a first surface and a second surface facing away from or opposite to the first surface. In this case, the first surface may refer to a light receiving surface upon which light is incident from the outside.

The substrate 112 may include a semiconductor substrate including a monocrystalline silicon material. The substrate 112 may include P-type impurities.

The photoelectric conversion regions 114 may be formed in the semiconductor substrate 112 and each photoelectric conversion region 114 can correspond to a unit pixel. The photoelectric conversion regions 114 may perform photoelectric conversion of incident light (e.g., visible light) filtered by the color filter layer 130 to generate photocharges that carry images in the incident light. Each of the photoelectric conversion regions 114 may include N-type impurities.

Each of the device isolation structures 116 may be formed between photoelectric conversion regions 114 of the adjacent unit pixels within the substrate 112 to isolate the photoelectric conversion regions 114 from each other. The device isolation structure 116 may include a trench structure such as a Back Deep Trench Isolation (BDTI) structure or a Front Deep Trench Isolation (FDTI) structure. Alternatively, the device isolation structure 116 may include a junction isolation structure formed by implanting high-density impurities (e.g., P-type impurities) into the substrate 112.

The anti-reflection layer 120 may be disposed over the first surface of the substrate layer 110, and may prevent reflection of light so that light incident upon the first surface of the substrate layer 110 can effectively reach the photoelectric conversion regions 114. Thus, as compared to the case where the anti-reflection layer 120 is not disposed over the first surface of the substrate layer 110, it is possible to reduce the amount of light that reflects without reaching the photoelectric conversion regions 114. In some implementations, the anti-reflection layer 120 may compensate for a difference in refractive index among the overcoating layer 152, each of the color filters (130R, 130G, 130B), and the substrate layer 110, and may thus enable light having penetrated the overcoating layer 152 and the color filters (130R, 130G, 130B) to be effectively incident upon the substrate layer 110. The anti-reflection layer 120 may operate as a planarization layer to compensate for (or remove) a step difference caused by predetermined structures formed on the substrate layer 110. The anti-reflection layer 120 may be formed of or include the same material as a capping layer 146 of the grid structure 140. For example, the anti-reflection layer 120 may be formed such that a capping layer 146 extends to a region between the substrate layer 110 and the color filters (130R, 130G, 130B) and also extends to a region between the overcoating layer 152 and the substrate layer 110. The anti-reflection layer 120 may include an ultra-low temperature oxide (ULTO) layer such as a silicon oxide (SiO₂) layer.

The color filters (130R, 130G, 130B) may be disposed in some of the spaces defined by the grid structure 140 and on the anti-reflection layer 120. The color filters (130R, 130G, 130B) may filter visible light from light incident through the lens layer 150 and transmit the filtered visible light to the corresponding photoelectric conversion regions 114. For example, the red color filter 130R may transmit red visible light. The green color filter 130G may transmit green visible light. The blue color filter 130B may transmit blue visible light.

The overcoating layer 152 may be formed in spaces between the color filters (130R, 130G, 130B) among the spaces defined by the grid structure 140 on the anti-reflection layer 120. Thus, while the color filters (130R, 130G, 130B) may be disposed in some of the spaces defined by the grid structures 140, there are remaining spaces where the color filters (130R, 130G, 130B) are not disposed. The overcoating layer 152 may be disposed in the remaining spaces. In some implementations of the disclosed technology, the overcoating layer 152 may serve as a white color filter.

The grid structure 140 may be disposed between the overcoating layer 152 and the color filters (130R, 130G, 130B) on the first surface of the substrate layer 110 to prevent crosstalk between the overcoating layer 152 and the color filters (130R, 130G, 130B). The grid structure 140 may be formed to vertically overlap the device isolation structure 116.

The grid structure 140 may include a metal layer 142, an air layer 144, and a capping layer 146. The metal layer 142 may include tungsten (W). The air layer 144 may be disposed over the metal layer 142 to overlap with the metal layer 142. The capping layer 146 may be a material layer formed at the outermost portion of the grid structure 140, and may be formed to cover a stacked structure of the metal layer 142 and the air layer 144. The capping layer 146 may include an ultra-low temperature oxide (ULTO) layer such as a silicon oxide (SiO₂) layer.

The lens layer 150 may include the overcoating layer 152 and a plurality of microlenses 154. The overcoating layer 152 may be formed to cover the color filters (130R, 130G, 130B). In addition, the overcoating layer 152 may be formed to cover the grid structure 140 and the anti-reflection layer 120 in a region where the color filters (130R, 130G, 130B) are not formed. The overcoating layer 152 may operate as a planarization layer to compensate for (or remove) a step difference caused by the color filters (130R, 130G, 130B). The overcoating layer 152 may include a photoresist material having no pigments. Alternatively, the overcoating layer 152 may include a thermosetting resin. The overcoating layer 152 may be formed to fill spaces in which the color filters (130R, 130G, 130B) are not formed, for example, spaces between the color filters (130R, 130G, 130B) from among the spaces defined by the grid structure 140, so that the overcoating layer 152 can serve as a white color filter.

The microlenses 154 may be formed over the overcoating layer 152. Each of the microlenses 154 may be formed in a convex lens shape, and may be formed for each unit pixel. The microlenses 154 may converge incident light, and may transmit the converged light to the corresponding photoelectric conversion regions 114. Each of the microlenses 154 may be formed of the same light transmissive photoresist material as the overcoating layer 152.

FIGS. 4A to 4F are cross-sectional views illustrating examples of methods for forming the color filters shown in FIG. 3 based on some implementations of the disclosed technology.

Figure 4A:
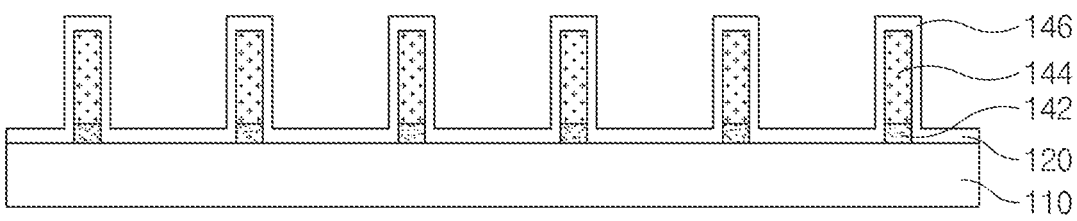
FIGS. 4A to 4F are cross-sectional views illustrating examples of methods for forming a grid structure shown in FIG. 3 based on some implementations of the disclosed technology.

Referring to FIG. 4A, a metal layer 142 and a sacrificial layer pattern 144' may be stacked in a region where the grid structure 140 is to be formed over the substrate layer 110 including the device isolation structure and the photoelectric conversion regions. A plurality of insulation layers 146 and 120 may be formed to cover the stacked structure and the substrate layer 110.

In some implementations, the metal layer 142 may include tungsten (W), and the sacrificial layer pattern 144' may include a carbon-containing spin-on carbon (SOC) layer. In addition, each of the insulation layers 146 and 120 may include an ultra-low temperature oxide (ULTO) layer such as a silicon oxide ($SiO_2$) layer. In the oxide layers 146 and 120, a region formed to cover the metal layer 142 and the sacrificial layer pattern 144' may serve as the capping layer 146, and a region formed to cover the substrate layer 110 may serve as the anti-reflection layer 120. Thus, the anti-reflection layer 120 and the capping layer 146 may be formed of or include the same material, and may be formed through the same process.

Figure 4B:
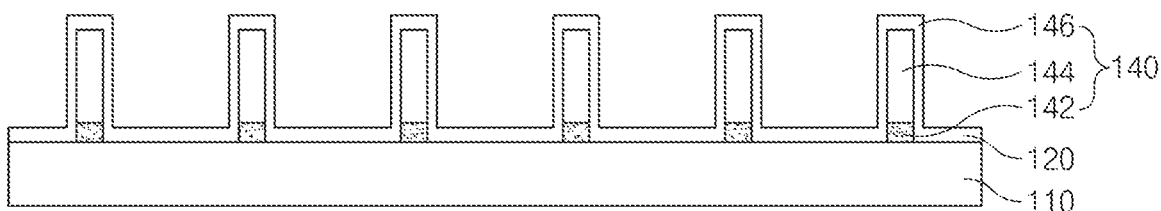

Referring to FIG. 4B, a plasma process may be carried out on the resultant structure of FIG. 4A by using gas (e.g., $O_2$, $N_2$, $H_2$, CO, $CO_2$, or $CH_2$) including at least one of oxygen, nitrogen, or hydrogen, such that the sacrificial layer pattern 144' may be removed and the air layer 144 may be formed at the position from which the sacrificial layer pattern 144' is removed.

For example, if the $O_2$ plasma process is carried out on the resultant structure of FIG. 4A, oxygen radicals (O*) may flow into the sacrificial layer pattern through the capping layer 146, and the oxygen radicals (O*) may be combined with carbons of the sacrificial layer pattern 144', resulting in formation of CO or $CO_2$. The formed CO or $CO_2$ may be discharged outside through the capping layer 146. As a result, the sacrificial layer pattern 144' can be removed, and the air layer 144 may be formed at the position where the sacrificial layer pattern 144' is removed, resulting in formation of the grid structure 140.

Figure 4C:
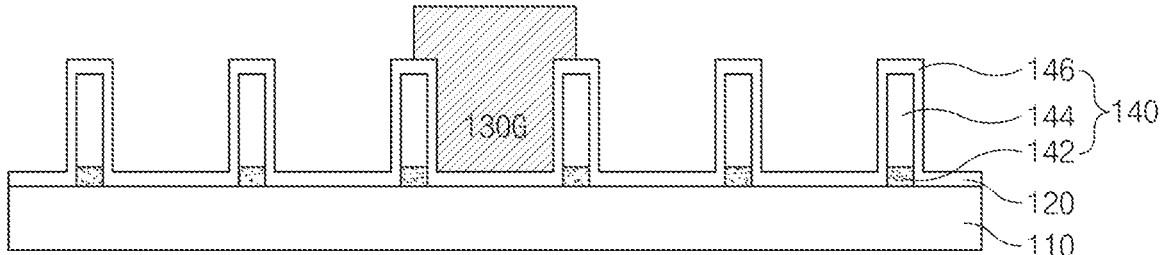

Referring to FIG. 4C, the green color filters 130G may be formed in some spaces among the spaces defined by the grid structure 140. For example, after a first color filter material layer is formed to cover the anti-reflection layer 120 and the grid structure 140, the first color filter material layer is patterned, resulting in formation of the green color filters 130G.

The green color filters 130G may be formed at positions where the green color filters are formed in the sub-pixel blocks (PB_GWr, PB_GWb) shown in FIG. 2. The first color filter material layer may include a photoresist material containing green pigments, and may be patterned through a photolithography process.

Subsequently, a descum process for surface treatment of the green color filters 130G may be performed. The descum process may be a nitrogen ($N_2$) descum process using nitrogen ($N_2$) gas.

Figure 4D:
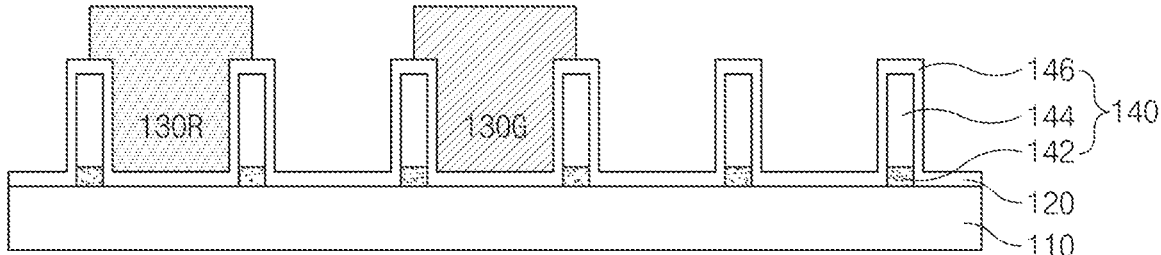

Referring to FIG. 4D, the red color filters 130R may be formed in some spaces among the spaces defined by the grid structure 140. For example, after the second color filter material layer is formed to cover the anti-reflection layer 120, the green color filters 130G, and the grid structure 140, the second color filter material layer is patterned, resulting in formation of the red color filters 130R.

The red color filters 130R may be formed at positions where the red color filters are formed in the sub-pixel blocks (PB_RW) shown in FIG. 2. The second color filter material layer may include a photoresist material containing red pigments, and may be patterned through a photolithography process.

Subsequently, a descum process for surface treatment of the red color filters 130R may be performed. The descum process may be a nitrogen ($N_2$) descum process using nitrogen ($N_2$) gas.

Figure 4E:
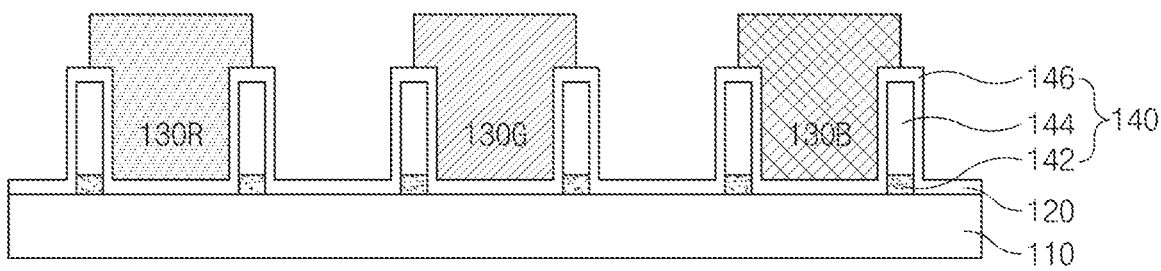

Referring to FIG. 4E, the blue color filters 130B may be formed in some spaces among the spaces defined by the grid structure 140. For example, after the third color filter material layer is formed to cover the anti-reflection layer 120, the green color filters 130G, the red color filters 130R, and the grid structure 140, the third color filter material layer is patterned, resulting in formation of the blue color filters 130B.

The blue color filters 130B may be formed at positions where the blue color filters are formed in the sub-pixel blocks (PB_BW) shown in FIG. 2. The third color filter material layer may include a photoresist material containing blue pigments, and may be patterned through a photolithography process.

Subsequently, a descum process for surface treatment of the blue color filters 130B may be performed. The descum process may be a nitrogen ($N_2$) descum process using nitrogen ($N_2$) gas.

Figure 4F:
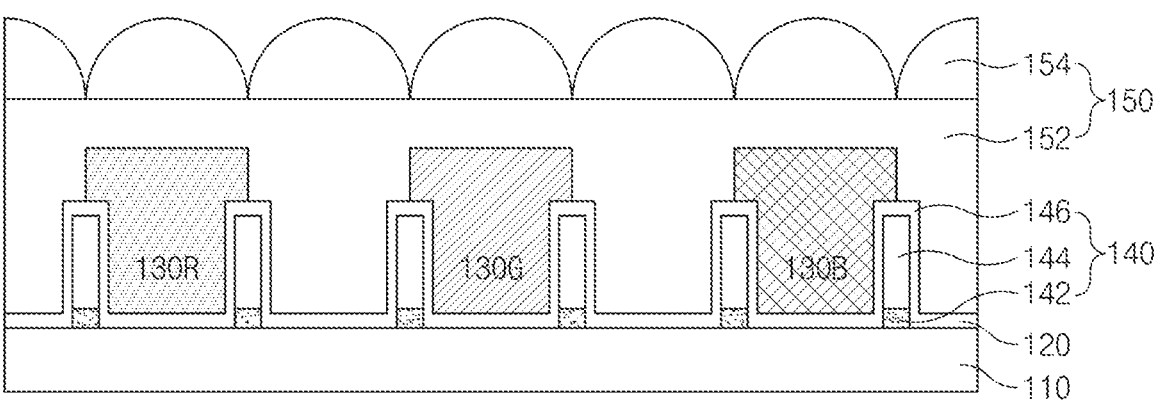

Referring to FIG. 4F, the overcoating layer 152 may be formed to cover the color filters (130G, 130R, 130B) while filling all of spaces between the color filters (130G, 130R, 130B) among the spaces defined by the grid structure 140. For example, the photoresist material containing no pigments may be formed to cover the color filters (130G, 130R, 130B) to a predetermined height while filling all of the spaces in which the color filters (130G, 130R, 130B) are not formed among the spaces defined by the grid structure 140. In this case, the top surface of the overcoating layer 152 may be planarized.

Subsequently, microlenses 154 may be formed over the overcoating layer 152. For example, after a photoresist pattern is formed over the overcoating layer 152 to correspond to each unit pixel, a reflow process is performed on the resultant photoresist pattern, resulting in formation of upwardly convex-shaped microlenses 154.

Figure 5:
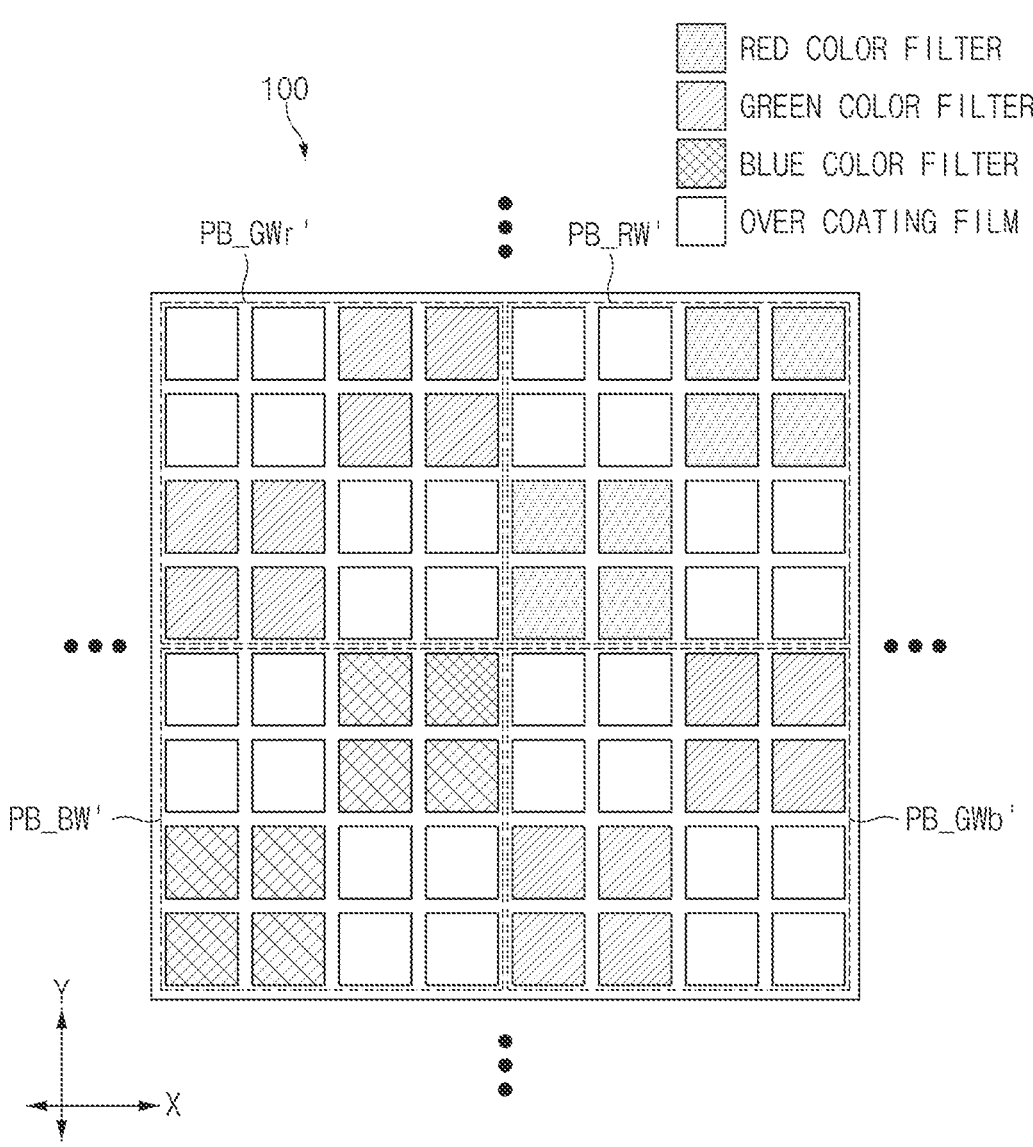
FIG. 5 is a schematic diagram illustrating an example of a planar structure in which pixels are arranged in a pixel array of FIG. 1 based on some implementations of the disclosed technology.

FIG. 5 is a schematic diagram illustrating another example of a planar structure in which pixels are arranged in the pixel array of FIG. 1 based on some implementations of the disclosed technology.

Referring to FIG. 5, the pixel array 100 may include a plurality of sub-pixel blocks (PB_RW', PB_GWr', PB_GWb', PB_BW').

The sub-pixel blocks (PB_RW', PB_GWr', PB_GWb', PB_BW') may be arranged in a diagonal direction in which two different types of color filters cross each other in the same manner as the sub-pixel blocks (PB_RW, PB_GWr, PB_GWb, PB_BW) shown in FIG. 2.

However, unlike the sub-pixel blocks (PB_RW, PB_GWr, PB_GWb, PB_BW) of FIG. 2, the sub-pixel blocks (PB_RW', PB_GWr', PB_GWb', PB_BW') may be formed in a quad structure in which the color filters having the same color are arranged adjacent to each other in a (2×2) array.

These quad-structured color filters may also be formed using the methods of FIGS. 4A to 4E.

Although the above-described embodiment has exemplarily disclosed a structure in which the color filters are arranged as shown in FIG. 2 or FIG. 5 for convenience of description, it is obvious to those skilled in the art that the above-described methods of FIGS. 4A to 4E can also be used to form the color filters even in other array structures each including white color filters.

As is apparent from the above description, the image sensing device based on some implementations of the disclosed technology can more easily form the color filters of the image sensing device including white color filters.

The embodiments of the disclosed technology may provide a variety of effects capable of being directly or indirectly recognized through the above-mentioned patent document.

Although a number of illustrative embodiments have been described, it should be understood that various modifications or enhancements of the disclosed embodiments and other embodiments can be devised based on what is described and/or illustrated in this patent document.

What is claimed is:

1. A method for manufacturing an image sensing device comprising:

forming a grid structure over a semiconductor substrate to provide spaces for disposing color filters;

forming first color filters, second color filters, third color filters in some of the spaces defined by the grid structure, the first color filters, the second color filters, and the third color filters configured to transmit light corresponding to a first color, a second color, and a third color, respectively;

forming an overcoating layer to cover the first to third color filters, the overcoating layer filling remaining spaces of the spaces defined by the grid structure, the remaining spaces free of the first to third color filters; and forming microlenses over the overcoating layer.

2. The method according to claim 1, wherein the forming the grid structure includes:

forming a stacked structure of a metal layer and a sacrificial layer pattern;

forming a capping layer covering the stacked structure and the semiconductor substrate; and removing the sacrificial layer pattern by performing a plasma process.

3. The method according to claim 2, wherein the forming the first to third color filters includes:

sequentially forming the first color filters, the second color filters, and the third color filters over the capping layer.

4. The method according to claim 2, wherein the plasma process is performed to form an area filled with air at a position from which the sacrificial layer pattern has been removed.

5. The method according to claim 2, wherein the plasma process is performed using at least one of oxygen, nitrogen, or hydrogen.

6. The method according to claim 1, wherein the forming the first to third color filters includes:

sequentially forming the first color filters, the second color filters, and the third color filters, wherein the first to third colors corresponding to green, red, and blue, respectively.

7. The method according to claim 1, wherein the forming the first to third color filters includes:

disposing color filters having a same color to be arranged adjacent to each other in a (2×2) array including two rows and two columns.

8. The method according to claim 1, wherein the forming the first to third color filters further includes:

performing a descum process on the first to third color filters disposed in the some of the spaces defined by the grid structure.

9. The method according to claim 8, wherein:

the descum process is performed using nitrogen ($N_2$) gas.

10. The method according to claim 1, wherein the forming the overcoating layer includes:

forming the overcoating layer to fill the remaining spaces between two of the first to third color filters such that color filters corresponding to different colors are not adjacent to each other.

11. The method according to claim 1, wherein the forming the overcoating layer includes:

forming a photoresist material free of pigments to cover top surfaces of the first to third color filters by a predetermined height while filling the remaining spaces between two of the first to third color filters.

12. An image sensing device comprising:

a grid structure disposed over a semiconductor substrate and including a portion that is filled with air and configured as an air layer;

a plurality of first color filters disposed in first spaces among the spaces defined by the grid structure, each first color filter configured to transmit light corresponding to a first color;

a plurality of second color filters disposed in second spaces among the spaces defined by the grid structure, each second color filter configured to transmit light corresponding to a second color;

a plurality of third color filters disposed in third spaces among the spaces defined by the grid structure, each third color filter configured to transmit light corresponding to a third color;

an overcoating layer disposed in fourth spaces among the spaces defined by the grid structure and covering the first to third color filters; and a plurality of microlenses disposed over the overcoating layer.

13. The image sensing device according to claim 12, wherein the grid structure further includes:

a metal layer disposed under the air layer; and a capping layer formed to cover a stacked structure of the metal layer and the air layer.

14. The image sensing device according to claim 13, wherein:

the capping layer is formed to extend to a region between the semiconductor substrate and the first to third color filters.

15. The image sensing device according to claim 12, wherein:

the overcoating layer is disposed between two of the first to third color filters such that color filters corresponding to different colors are not adjacent to each other.

16. The image sensing device according to claim 15, wherein:

the fourth spaces are adjacent to the first space, the second space, and the third space.

17. The image sensing device according to claim 12, wherein:

the first to third color filters are configured such that color filters corresponding to a same color are arranged adjacent to each other in a (2×2) array including two columns and two rows.

18. The image sensing device according to claim 13, further comprising an anti-reflection layer disposed on the semiconductor substrate and having a same material as a material of the capping layer.

* * * * *